United States Patent [19]

Chuang

[11] 4,415,827
[45] Nov. 15, 1983

[54] MICRORESONATOR OF TUNING FORK CONFIGURATION OPERATING AT ITS SECOND OVERTONE FREQUENCY

[75] Inventor: Shih Chuang, Irvine, Calif.

[73] Assignee: Statek Corporation, Orange, Calif.

[21] Appl. No.: 267,814

[22] Filed: May 27, 1981

[51] Int. Cl.³ .......................................... H01L 41/08
[52] U.S. Cl. .................................. 310/370; 310/366
[58] Field of Search ...................... 310/370, 366, 348

[56] References Cited

U.S. PATENT DOCUMENTS 4,173,726  11/1979  Hanji ............................. 310/370 X

FOREIGN PATENT DOCUMENTS 54-111297  8/1979  Japan ................................. 310/366
55-13551   1/1980  Japan ................................. 310/370

Primary Examiner—Mark O. Budd
Attorney, Agent, or Firm—Pollock, Vande Sande & Priddy

[57] ABSTRACT

An improved piezoelectric tuning fork (12) is disclosed in which the electrodes which drive the tuning fork (30, 32, 34; 36, 38, 40; 42, 48, 50; 52, 54, 56; 58, 60, 62; 64, 66, 68) are positioned along the tines (16, 18) so as to optimize operation at the second overtone frequency.

24 Claims, 20 Drawing Figures

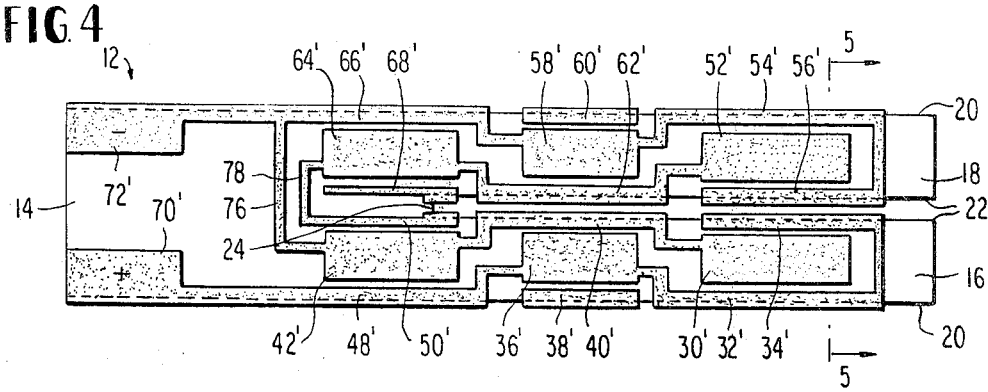
FIG. 4
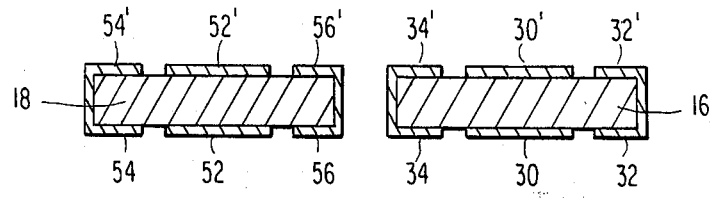
FIG. 5
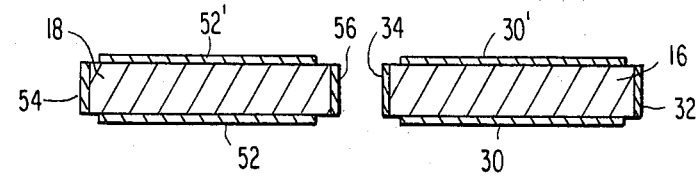
FIG. 6
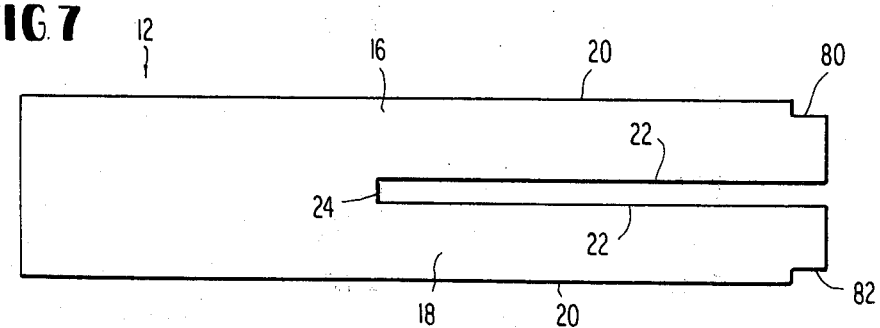
FIG. 7
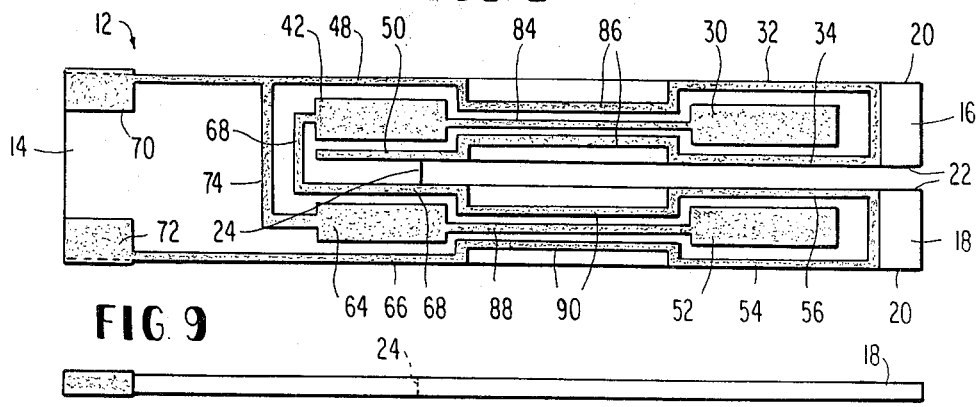
FIG. 8
FIG. 9

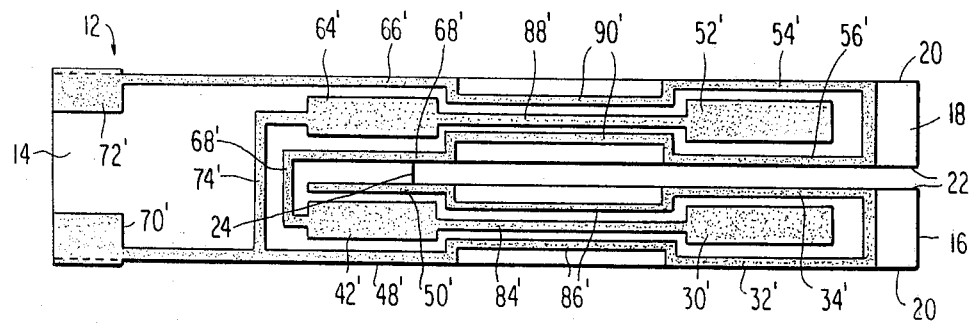
FIG. 10
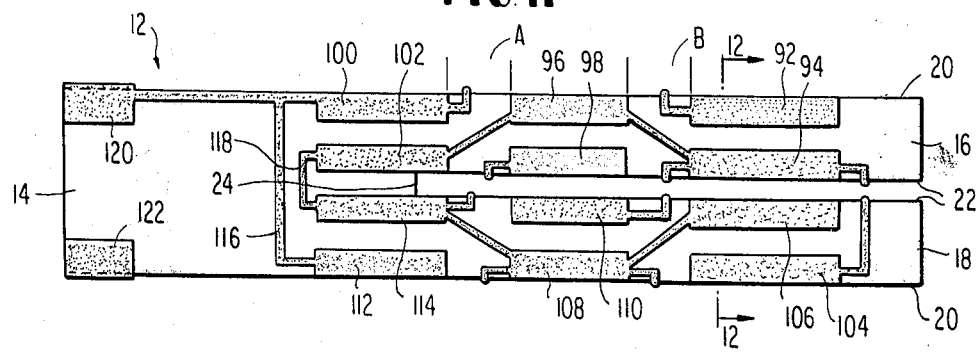
FIG. 11
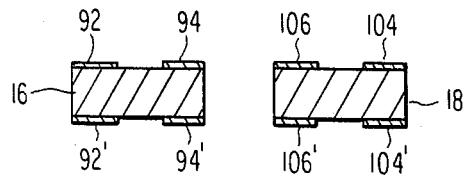
FIG. 12
FIG. 13
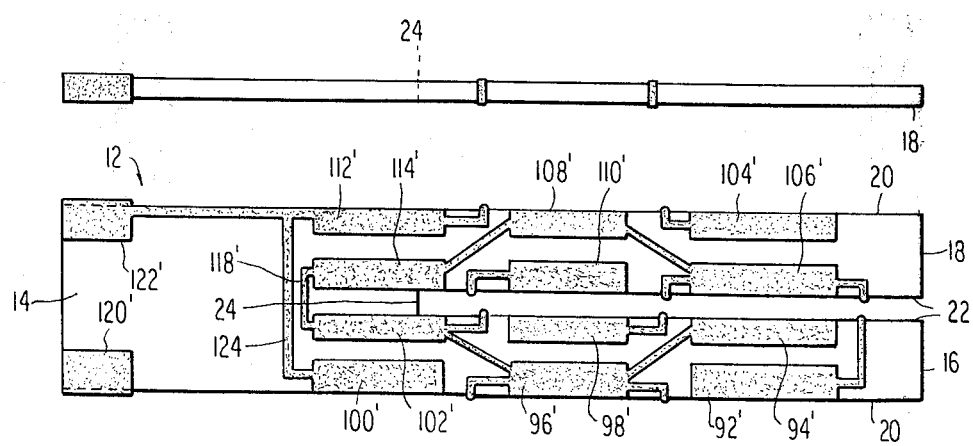
FIG. 14

CONVENTIONAL PIERCE OSCILLATOR

CONVENTIONAL SERIES OSCILLATOR

MICRORESONATOR OF TUNING FORK CONFIGURATION OPERATING AT ITS SECOND OVERTONE FREQUENCY

DESCRIPTION

1. Technical Field

This invention concerns microresonators having a tuning fork configuration which may be combined with known oscillator circuits to produce a very accurate, high frequency signal source particularly suited for use in applications where an accurate, high frequency signal source is required, such as in time measurement systems and, more recently, in transducers where the frequency of the resonator changes as a function of force, pressure and temperature or other ambient conditions. More particularly, the invention concerns such a microresonator which is uniquely configured to operate at its second overtone frequency and yet to suppress fundamental and first overtone components. Operation at higher frequencies and ambient temperatures is thereby facilitated.

2. Background Art

Piezoelectric resonators have been known since at least the early 1940's when work completed at Bell Laboratories was reported. Over the years, such devices have been made smaller and smaller to facilitate their use as accurate signal sources in time measuring devices, for example. In approximately the last decade, microresonators made from piezoelectric materials such as quartz have been developed, as shown in U.S. Pat. Nos. 3,488,530; 3,969,640 and 3,766,616, issued to Juergen H. Staudte. The application of microphotolithographic processes developed in the integrated electronic circuit industry has permitted high volume manufacture of microresonators small enough for incorporation into ladies' wristwatches. A summary of various tuning fork and electrode geometries for use in such microresonators is presented in U.S. Pat. No. 3,969,641 issued to Oguchi et al.

The microresonators shown in most of the previously mentioned prior art patents have been made from piezoelectric materials such as quartz and configured so that they will operate at a fundamental frequency of 32.768 kHz, a frequency particularly suited for use in quartz watches. Of course, where other operating frequencies are desired, the tuning fork geometry and oscillator circuit parameters have been adjusted as necessary to produce the desired fundamental operating frequency. An inherent feature of such microresonators is that their frequency changes rather quickly if the ambient temperature is significantly below or above an optimum temperature commonly referred to as the turning point temperature of the microresonator. So, a microresonator quite suitable for use at normal room temperature or at normal human body temperature would not maintain its desired fundamental frequency if caused to operate at a significantly different ambient temperature.

In an effort to produce a microresonator which operates reliably at much higher turning point temperatures, attempts have been made to design tuning forks which operate at the first overtone frequency, which has a significantly higher turning point temperature than that of the lower, fundamental frequency. However, a need has continued to exist for a microresonator which will operate at still higher frequencies and turning point temperatures.

DISCLOSURE OF THE INVENTION

The primary object of the present invention is to provide an improved microresonator of tuning fork configuration which is adapted to operate at its second overtone frequency and yet to suppress fundamental and first overtone components.

Another object of the present invention is to provide such a microresonator which may be made using microphotolithographic processes of the general type previously used to manufacture tuning forks for operation at the fundamental frequency.

Another object of the invention is to provide such a microresonator which has a reduced sensitivity to the position of the tuning fork on its support pedestal.

These objects of the invention are given only by way of example. Thus, other desirable objectives or advantages inherently achieved by the disclosed invention may occur or become apparent to those skilled in the art. Nonetheless, the scope of the invention is to be limited only by the appended claims.

A flexural mode piezoelectric tuning fork according to the present invention is made from a thin plate of piezoelectric material such as quartz. The tuning fork includes a flat stem portion from which extend an integral pair of parallel tines. Between the tines, a slot is defined which terminates at a crotch where the tines join the stem of the fork. On at least one side of the tuning fork, electrodes are mounted on the tines in order to cause the fork to oscillate preferentially at its second overtone frequency when an oscillating electrical field is applied to the electrodes. The electrodes are positioned on the tines so that fundamental and first overtone components of these oscillations are suppressed.

The tines and stem of the flexural mode tuning fork are defined in part by first and second substantially planar, opposed surfaces. On at least one of these surfaces, a plurality of sets of electrodes are disposed, preferably with two or three sets spaced along the length of each tine. Each set of electrodes comprises a pair of side electrodes disposed along at least a portion of the opposite edges of its tine and a central electrode disposed between and spaced from each pair of side electrodes. The sets of electrodes are spaced along their tine so that as the tine vibrates at its second overtone frequency, the piezoelectric material at the respective edge of the tine which underlies substantially the entire length of each respective side electrode, will experience at a given instant only a single state of stress at each respective side electrode. This single state of stress will be either a tensile stress, a compressive stress or zero stress. That is, at a given instant, the material at the edge of the tine underlying substantially the entire length of each side electrode will not be subject to tensile stress at one point and compressive stress at another point along the length of the side electrode. As used in this specification, "substantially the entire length of each side electrode" means more than 90% of the length of each side electrode.

Preferably, three sets of central and side electrodes are provided on each side of each tine for optimum operation at the second overtone frequency with enhanced suppression of fundamental and first overtone modes. On the top surface, each tine has a first set of electrodes positioned near the tip of the tine, a second set of electrodes positioned near the base of the tine, and a third set of electrodes positioned therebetween. On its bottom surface, each tine has a fourth, further set of electrodes positioned toward the tip of the tine, a fifth, further set of electrodes positioned toward the base of the tine, and a sixth, further set of electrodes positioned therebetween. Conductors such as metalized tracks are deposited directly on the piezoelectric material to interconnect the central electrodes of the first, second, fourth and fifth sets of electrodes with the side electrodes of the third and sixth sets of electrodes, all for operation at a common polarity. Similarly, electrical conductors are deposited to interconnect the central electrodes of the third and sixth sets of electrodes with the side electrodes of the first, second, fourth and fifth sets of electrodes, all for operation at a common, opposite polarity. The electrodes on the two tines are interconnected so that those on one tine operate at an opposite polarity from their counterparts on the other tine, in order to ensure that the tines move in opposite directions during operation. Two sets of central and side electrodes also may be provided on each side of each tine, one set near the tip and one set near the base, the central set being omitted.

The side electrodes on the top and bottom surfaces of each tine are interconnected not only by conductors deposited on the surfaces, but also by conductors which extend along the exterior and interior edges of the tines, these edges extending, respectively, from the stem to the tip and from the crotch to the tip of each tine. Thus, the side electrodes of the first and fourth sets of electrodes, the side electrodes of the third and sixth sets of electrodes, and the side electrodes of the second and fifth sets of electrodes are interconnected along the interior and exterior edges of the tines.

In the previously described embodiment of the invention, the tines and stem of the tuning fork are made from a plate of quartz crystal, the plate being formed with its thickness initially measured in the Z direction of the crystal and its length initially measured in the Y direction of the crystal. The plate is rotated, in the conventional manner, about the X axis of the crystal by an angle $\theta$ in the range $-25°$ to $+25°$ and about the Y' axis by an angle $\phi$ in the range of $-35°$ to $+35°$. Using the notation specified in standard number 176-1978 of the Institute of Electrical and Electronics Engineers, Inc., this quartz plate is designated as (ZYwl) $-25°$ to $+25°/-35°$ to $+35°$.

In a second type of tuning fork according to the invention, the sets of central and side electrodes previously described are replaced by pairs of side electrodes disposed along the edges of the tines. As indicated previously, the tines and stem are defined in part by first and second substantially planar opposed surfaces. Two or three pairs of side electrodes are disposed on the top surface of each tine, each member of each pair of side electrodes being disposed opposite the other member of the pair, along at least a portion of the opposite edges of its tine. Each member of each pair of side electrodes is spaced along its tine so that as the tine vibrates at its second overtone frequency, the piezoelectric material at the respective edge of the tine underlying substantially the entire length of each respective side electrode will experience at any given instant only a single state of stress at each respective electrode. This single state of stress is either a tensile stress, a compressive stress or zero stress, as previously discussed. Preferably, further pairs of side electrodes are disposed on the bottom surface of each tine, each member of the further pairs of side electrodes being disposed opposite the other member of the further pairs along at least a portion of the opposite edges of its tine. Each further pair of side electrodes also is spaced along its tine, so that as the tine vibrates at its second overtone frequency, the piezoelectric material at the respective edge of the tine underlying substantially the entire length of each respective, further side electrode will experience at any given instant only a single state of stress, in the manner previously described.

In this second embodiment of the invention, each tine has an outer edge extending from the base and an inner edge extending from the crotch of the fork. On the top surface of the tuning fork, each tine has a first pair of side electrodes positioned along the edges near the tip of the tine, a second pair of side electrodes positioned along the edges near the base of the tine, and a third pair of side electrodes positioned along the edges therebetween. It is also within the scope of the invention to use electrode pairs only at the tip and the base of the tine. On its bottom surface, each tine has a fourth, further pair of electrodes positioned along its edges near the tip of the tine, a fifth, further pair of electrodes positioned along its edges near the base of the tine, and a sixth, further pair of electrodes positioned along its edges therebetween. Electrical conductors such as metalized tracks are deposited directly on the piezoelectric material to interconnect at a common polarity the outer side electrodes of the first, second and sixth pairs with the inner side electrodes of the third, fourth and fifth pairs. Similarly, electrical connectors are deposited to interconnect at a common, opposite polarity the inner side electrodes of the first, second and sixth pairs with the outer side electrodes of the third, fourth and fifth pairs. Additional electrical conductors are deposited to interconnect the electrode pairs to cause the electrodes on the top surface of each tine to operate at opposite polarity from electrode pairs directly opposite them on the bottom surface of each tine.

In this second embodiment, the tines and stem of the tuning fork are made from a plate of quartz crystal, the plate being formed with its thickness initially measured in the X direction of the crystal and its length measured in the Y direction of the crystal. The plate is rotated about the X axis of the crystal by an angle $\theta$ in the range of $-25°$ to $+25°$ and about the Y' axis by an angle $\phi$ in the range of $-55°$ to $+55°$. Using the previously mentioned notation, such a crystal plate is designated (XYtl) $-25°$ to $+25°/-55°$ to $+55°$.

BRIEF DESCRIPTION OF THE DRAWINGS

FIG. 4 shows a bottom view of the tuning fork of FIG. 2.

FIG. 5 shows a section view taken along line 5—5 of FIG. 4.

FIG. 6 shows another electrode geometry which may be used in place of that shown in FIG. 5.

FIG. 7 shows a tuning fork according to the present invention which has been modified at the tips of its tines in order to enhance suppression of first overtone components during second overtone operation, to improve the Q of the tuning fork at second overtone and to reduce the sensitivity of the tuning fork to its mounting position.

FIG. 8 shows a top view of a modified version of the embodiment of FIGS. 2-7.

FIG. 9 shows a side view of the embodiment of FIG. 8.

FIG. 10 shows a bottom view of the embodiment of FIG. 8.

FIG. 11 shows a top view of a further embodiment of the invention.

FIG. 12 shows a section view taken along line 12—12 of FIG. 11.

FIG. 13 shows a side view of the embodiment of FIGS. 11 and 12.

FIG. 14 shows a bottom view of the embodiment of FIG. 11.

BEST MODE FOR CARRYING OUT THE INVENTION

Figure 1A:
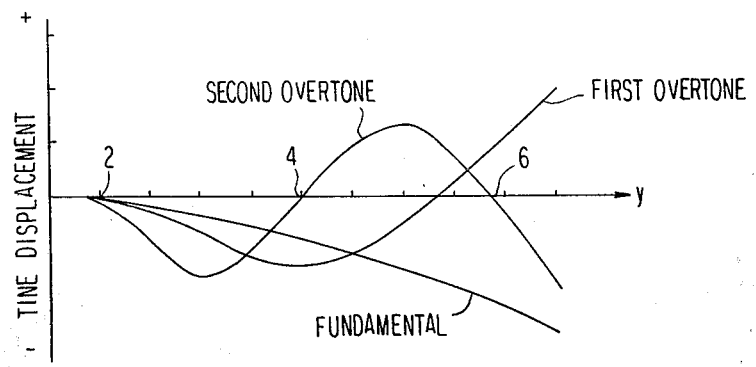
FIG. 1A shows a plot of maximum tine displacement of a piezoelectric tuning fork, displacement being measured in the width direction of the tine at various locations along the length of the tine. Curves are included to show tine displacement during operation at the fundamental, first overtone and second overtone frequencies.

The following is a detailed description of the preferred embodiments of the invention, reference being made to the drawings in which like reference numerals identify like elements of structure in each of the several Figures.

Figure 1B:
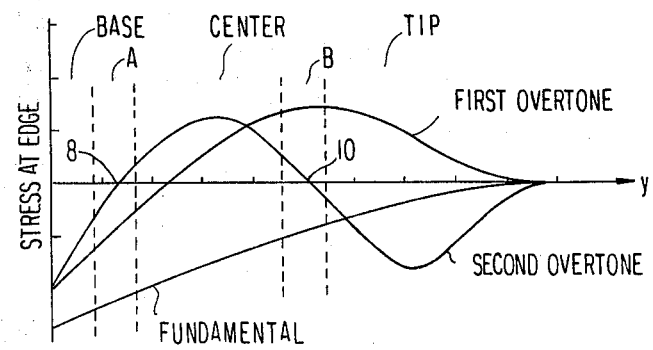
FIG. 1B shows a typical plot of maximum stress along an edge of a tuning fork tine for a given time in a cycle of the tine's oscillation. The Figure illustrates stress for the fundamental, first overtone and second overtone frequencies.

FIG. 1A shows plots of lateral displacement and FIG. 1B shows plots of stress, in both cases measured along the length of the edge of a tine of a flat piezoelectric tuning fork of the general type shown in FIGS. 2-17 of this application, or in FIG. 1 of U.S. Pat. No. 3,683,213. In FIGS. 1A and 1B, the origin of the Y axis theoretically would be placed at the crotch between the tines of the tuning fork; however, in actual practice, it is found that the indicated displacement and stress variations occur as much as approximately one-half tine width below the crotch.

When such a flat piezoelectric tuning fork is operated at its fundamental frequency, its tines oscillate back and forth between extreme positions on either side of the Y axis, only one of these positions being illustrated in FIG. 1A. Although in the fundamental mode, the tine moves in one direction along its entire length, in the first overtone mode, the portion of the tine closer to the crotch moves in one direction and the portion of the tine closer to the tip moves in the opposite direction, as illustrated. Similarly, in the second overtone mode, the portion of the tine closest to the crotch moves in one direction; a central portion of the tine moves in the opposite direction; and the portion of the tine closest to the tip moves in the same direction as the portion closest to the crotch, as illustrated. Due to this differential movement of the edge portion of each tine during operation at the first or second overtone frequencies, the material of the tine along the edge will at some locations be in compression and at other locations be in tension during one-half of a cycle. During the other half of a cycle, the state of stress at each portion will reverse.

Regarding operation in the second overtone mode, it can be shown that although a displacement curve such as that shown in FIG. 1A would seem to suggest that a single state of stress, either tensile or compressive, would exist between points 2 and 4 and between point 6 and the end of the tine and that the opposite state of stress would exist between points 4 and 6, this pattern of stress reversal does not actually occur at the points of zero displacement. It can be shown that the stress levels in the material at the edges of the tine are proportional to the second derivative of the displacement of the tine. In other words, the zero stress points in the tine do not always correspond with the points of highest magnitude of displacement of the tine, but are positioned as in FIG. 1B.

Applicant has found that in order to provide a tuning fork which will operate optimally at its second overtone frequency, the electrodes should be located on the tine so that, except for small metallized interconnections deposited on the tine between electrodes, no electrode crosses points 8 and 10 at which the stress and charge density at the edge of the tine can be shown to change sign. FIG. 1B shows regions A and B extending on either side of cross-over points 8 and 10 to define narrow regions through which electrical connectors may be run from electrode to electrode but into which no electrode projects. In theory, Regions A and B may be made as narrow as practical and still allow electrical connectors to pass points 8 and 10. In actual practice, due to some calculational uncertainties in the location of points 8 and 10, regions A and B are chosen to be approximately 0.5 to 1.0 times the width of a tine.

Applicant has found that when the electrodes for driving a piezoelectric tuning fork at its second overtone frequency are located on the tip and stem sides of regions A and B, or on both the tip and stem sides of and between regions A and B, then superior performance is achieved with enhanced suppression of fundamental and overtone components. With the electrodes positioned in this manner, the material at the edge of each tine underlying an electrode at that location will experience at any given instant a single state of stress. That is, the stress will be tensile, compressive or zero along the edge of the tine under the electrode. In this manner, coupling of the mechanical and electrical driving forces is maximized since essentially no portion of the tine is simultaneously subjected to electrical and mechanical forces tending to deflect it in opposite directions. If a portion of the electrode should happen to extend past one of points 8 or 10, then operation at the second overtone frequency will be impaired somewhat and suppression of fundamental and first overtone components will be lessened. It is preferred that substantially the entire lengths of each electrode be located in such a region of single state of stress. Superior performance is still achieved when no more than 10% of the length of the electrode extends past one of points 8 and 10.

Figure 2:
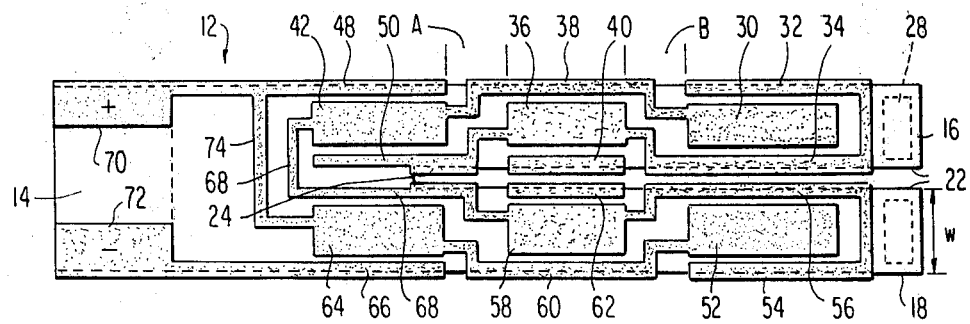
FIG. 2 shows a top view of one embodiment of a tuning fork according to the present invention.
Figure 3:
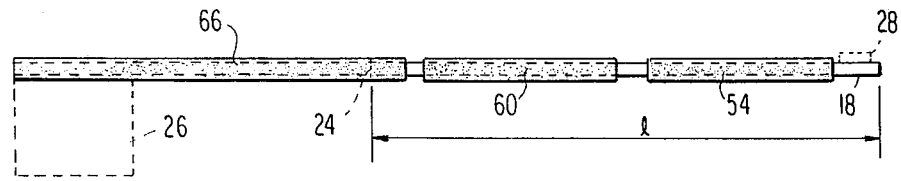
FIG. 3 shows a side view of the tuning fork of FIG. 2.

FIGS. 2-17 illustrate various embodiments of the invention in which the electrodes of the tuning fork have been placed along its tines so that, except for interconnections, no electrode extends past cross-over points 8 and 10. Referring simultaneously to FIGS. 2-4, it will be seen that a flat piezoelectric tuning fork 12 comprises a rectangular stem portion 14 from which extend integral tines 16 and 18, each tine having an outer edge 20 extending from stem 14 to the tip of the tine and an inner edge 22 extending from a crotch 24 between the tines to the tip of the tines. Each tine has a length l measured from crotch 24 and a transverse width w. In use, tuning fork 12 is supported on a pedestal 26, shown in phantom in FIG. 3, which provides both mechanical support and electrical connection to a separate oscillator circuit such as the type shown in FIGS. 18 and 19. At the ends of tines 16, 18, a pair of trimming weights or pads 28, shown in phantom, may be provided for adjusting the final frequency of the tuning fork in the now familiar manner.

As an aid to understanding, FIG. 2 schematically illustrates the location of regions A and B previously described with regard to FIG. 1B. Those skilled in the art will appreciate that the various electrodes and interconnections now to be described may be deposited directly on stem 14 and tines 16, 18 using microphotolithographic processes. At the tip of tine 16 below the location of trimming weights 28, a central electrode 30 is deposited which is flanked by and spaced from side electrodes 32, 34 which extend, respectively, along outer edge 20 and inner edge 22 of tine 16. Side electrodes 32, 34 are connected by a conductor deposited above the tip end of central electrode 30, as indicated. Between regions A and B, a central electrode 36 is deposited flanked by side electrodes 38, 40 which extend along outer edge 20 and inner edge 22 of tine 16. Central electrode 36 is connected to side electrode 34; side electrode 38 is connected to central electrode 30; and side electrode 40 is connected to electrodes on the opposite surface of the tuning fork, by a metallization which extends across edge 22 as will be described subsequently. On the opposite side of region A, a central electrode 42 is deposited flanked by side electrodes 48 and 50 which extend along outer edge 20 and inner edge 22 of tine 16. Preferably, electrodes 42, 48 and 50 extend approximately one tine width below crotch 24 to ensure that they are past the nodal point considered to be located in stem 14. Central electrode 42 is connected to side electrode 38, side electrode 50 is connected to central electrode 36; and side electrode 48 is connected to one of the input leads to the tuning fork.

On tine 18, a symmetrical arrangement of electrodes is provided. At the tip of tine 18, a central electrode 52 is deposited flanked by side electrodes 54, 56 which extend along the inner and outer edges of tine 18. Electrodes 54, 56 are connected by a conductor deposited across the tip end of central electrode 52, as indicated. Between regions A and B on tine 18, a central electrode 58 is deposited flanked by side electrodes 60, 62 which extend along the inner and outer edges of tine 18. Central electrode 58 is connected to side electrode 56; side electrode 60 is connected to central electrode 52; and side electrode 62 is connected to electrodes on the opposite surface of the tuning fork by a metallization which extends across edge 22. On the other side of region A, a central electrode 64 is deposited flanked by side electrodes 66, 68 which extend along the inner and outer edges of tine 18. Central electrode 64 is connected to side electrode 60; side electrode 66 is connected to the other of the input leads to the tuning fork; and side electrode 68 is connected to central electrode 58. As in the case of electrodes 42, 48 and 50, electrodes 64, 66 and 68 extend below crotch 24 a distance of approximately one tine width. Pads 70, 72 are deposited at the base of stem 14 for bringing electrical power to and from the tuning fork. A conductor 74 is connected to side electrode 48 and pad 70 and also to central electrode 64. Pad 72 is connected to side electrode 66.

FIG. 4 shows the bottom side of the tuning fork illustrated in FIGS. 2 and 3. Since the array of electrodes in FIG. 4 is similar to that of FIGS. 2 and 3, primed reference numerals have been used to identify the electrodes shown in FIG. 4. Thus, central electrode 30' and side electrodes 32' and 34' are situated on the bottom of tine 16 directly opposite to electrodes 30, 32 and 34. As shown in FIG. 5, electrodes 32, 32' and 34, 34' are electrically interconnected by metallization which extends across the side edges of tine 16 and electrodes 32' and 34' are connected by a metallization across the tip end of tine 16.

Between regions A and B, central electrode 36' and side electrodes 38', 40' are positioned directly opposite to electrodes 36, 38 and 40. Side electrodes 38, 38' and 40, 40' are interconnected by metallization which extends across the side edges of tine 16. Central electrode 36' is connected to side electrode 32' and side electrode 40' is connected to central electrode 30'. On the other side of region A, central electrode 42' flanked by side electrodes 48', 50' is deposited directly opposite to electrodes 42, 48 and 50. Electrodes 48, 48' and 50, 50' are interconnected by metallization which extends across the edges of tine 16 above crotch 24. Central electrode 42' is connected to side electrode 40'.

On the bottom surface of tine 18, central electrode 52' flanked by side electrodes 54', 56' is deposited directly opposite to electrodes 52, 54 and 56. Electrodes 54, 54' and 56, 56' are interconnected by metallization on the side edges of tine 18 and electrodes 54', 56' are connected by a metallization across the tip end of tine 18. Between regions A and B, central electrode 58' flanked by side electrodes 60', 62' is deposited directly opposite to electrodes 58, 60 and 62. Electrodes 60, 60' and 62, 62' are interconnected by metallization which extends across the side edges of tine 18; and central electrode 58' is connected to side electrode 54'. On the other side of region A, central electrode 64' flanked by side electrodes 66', 68' is deposited directly opposite to electrodes 64, 66 and 68. Side electrodes 66, 66' and 68, 68' are connected by metallization which extends across the side edges of tine 18 above crotch 24. Connection pads 70', 72' and pads 70, 72 also are connected by metallization which extends across side edges 20. A conductor 76 connects central electrode 42' to side electrode 66' and a conductor 78 connects side electrode 50' with central electrode 64'.

Because of the locations and interconnections of the electrodes just described, application of an alternating field to pads 70, 72 will cause central electrodes 30, 30', 42, 42' and 58, 58' along with side electrodes 38, 38', 40, 40', 54, 54' 56, 56', 66, 66' and 68, 68' to assume one polarity and the remaining central electrodes and side electrodes to assume the opposite polarity. In response, tines 16, 18 will move in opposite directions since the polarities of the corresponding sets of electrodes on each tine are opposite.

FIGS. 2 to 5 show that the various side electrodes are interconnected by metallization which extends across and along the inner and outer edges of tines 16 and 18.

FIG. 6 illustrates a modified embodiment of the invention in which the side electrodes are confined essentially to the side edges of tines 16, 18. In such a case none of the side electrode extends onto the top or bottom surfaces of the tine; however, small interconnections are deposited across edges 20, 22 to interconnect the side electrodes in the manner previously described, as will be understood by those skilled in the art. Such small interconnections are shown, for example, in FIGS. 11-14. Either of the arrangements shown in FIGS. 5 and 6 is considered to be within the scope of the present invention.

Although it is believed that those skilled in the arts of manufacturing microresonators and integrated circuits using photolithographic processes will readily appreciate the various processes which can be used to manufacture the types of tuning forks shown in FIGS. 2-17, a greatly simplified example of such a process will now be described. A wafer of a suitable piezoelectric material such as (ZYwl) $-25°$ to $+25°/-35°$ to $+35°$ quartz is provided, having a sufficient surface area to simultaneously manufacture a plurality of tuning forks. The wafer is metallized on both sides using, for example, a layer of chromium and a layer of gold. A suitable photoresist material such as a positive resist is then applied to the metallized surface. After suitable masking, the photoresist is exposed to define the outlines of the tuning forks and then developed to remove the exposed resist material. The metallization is then etched away in the developed areas. Then the underlying quartz is etched away in the developed areas to leave partially completed forks attached to a frame formed in the wafer. The partially completed forks are then masked and exposed to define the desired electrode pattern on the stem and tines of each tuning fork. The exposed photoresist material is then developed, after which the metallization is etched away to leave the desired electrode pattern. Then, the remaining unexposed resist is removed and a mechanical aperture mask is applied to cover the top and bottom surfaces of the forks and to shield from metallization those portions of edges 20, 22 of each tuning fork where no metallization is desired. The portions of edges 20, 22 exposed through the mechanical aperture are then metallized to provide the desired interconnections between the previously deposited side electrodes, after which the mask is removed from the top and bottom surfaces to expose the completed tuning forks. The forks are then removed from the wafer frame for subsequent processing.

In one actual embodiment of the invention shown in FIGS. 2-6, tuning fork 12 had a thickness of approximately 5 mils, an overall length of 170 mils and an overall width of 35 mils. Tines 16, 18 were 100 mils long and 16 mils wide. Electrodes 30, 52 and 42, 64 were 30 mils long, regions A and B were approximately 12 mils wide and electrodes 36, 58 were 23 mils long. The side electrodes and interconnecting strips were approximately 2.5 mils wide. Similar proportions may be used for the embodiments of FIGS. 7-17.

FIG. 7 illustrates schematically the exterior outline of a modified version of the tuning fork 12 illustrated in FIGS. 2-6. While the arrangement of central and side electrodes illustrated in FIGS. 2-6 ensures that the tuning fork will operate at its second overtone frequency and that fundamental and first overtone components will be suppressed to a considerable extent, it is also within the scope of the invention to provide for further suppression of first overtone components by removing a portion of the tips of tines 16 and 18. Thus, small notches or tapered portions 80, 82 may be removed from the outside edges 20 of tines 16, 18 to improve the quality factor Q of the resultant tuning fork. As the amount of material removed increases, the Q increases to a point and then begins to decrease. The amount to be removed in a given instance will be a function of the tine length and width selected for a particular application.

FIGS. 8-10 illustrate a modified version of the embodiment of FIGS. 2-7 in which the central and side electrodes between regions A and B have been omitted. In this embodiment, the first overtone components are adequately suppressed for operation at the second overtone frequency; however, some fundamental components may appear in the output of the device. For simplicity, corresponding elements in FIGS. 8-10 have been given the same numbers as those found in FIGS. 2-4. Central electrodes 30 and 42 are connected by a narrow metallized strip 84 which extends along the center of tine 16. Similarly, side electrodes 32, 34 and 48, 50 are joined by narrow metallized strips 86 which also extend close to the center of tine 16, well spaced from edges 20, 22. Placement of conductors 84, 86 close to the center of tine 16 minimizes any adverse coupling which would occur if these conductors were positioned at the edges of the tine between regions A and B. In a similar fashion on tine 18, central electrode 52 is connected to central electrode 64 by a narrow metallized strip 88 which extends down the center of tine 18 and side electrodes 54, 56 are connected to side electrodes 66, 68 by narrow metallized strips 90 which also extend close to the center of tine 18 for the reasons just discussed.

A fork having the electrode arrangement shown in FIG. 8 may be operated at the second overtone frequency with electrodes on one surface only or, alternatively, the tuning fork may be provided with an electrode arrangement on its opposite surface such as that shown in FIG. 10. As in the case of FIG. 4, corresponding electrodes on the bottom surface have been given primed numbers to indicate their location directly opposite electrodes on the top surface. However, it should be noted that in the embodiment of FIGS. 8-10, no metallization is required across edges 20, 22 except at the location of pads 70, 70' and 72, 72'. When electrodes are provided on both the top and bottom surfaces, improved electromechanical coupling, higher motional capacitance and lower motional resistance are achieved, compared to a tuning fork which includes only the electrodes shown in FIG. 8. Also, to provide even better performance, side metallization may be provided on the edges of tines 16 and 18 in order to electrically connect the side electrodes in the manner previously described with regard to FIGS. 2-4. Of course, this latter alternative adds to the cost of this embodiment.

FIGS. 11-14 illustrate a further embodiment of the invention in which the sets of central and side electrodes shown in FIGS. 2-10 are replaced by similarly positioned pairs of opposite polarity electrodes positioned along inner and outer edges 20, 22. As shown in FIG. 11, an outer side electrode 92 and an inner side electrode 94 are deposited near the tip of tine 16. Between regions A and B, an outer side electrode 96 and an inner side electrode 98 are deposited. Outer side electrode 96 is connected by a narrow diagonal metallized strip to inner side electrode 94. On the other side of region A near crotch 24 an outer side electrode 100 and an inner side electrode 102 are deposited. Inner side electrode 102 is connected by a narrow diagonal metallized strip to outer side electrode 96. On tine 18, an inner side electrode 106 and an outer side electrode 104 are deposited near the tip. Between regions A and B, an outer side electrode 108 and an inner side electrode 110 are deposited. Outer side electrode 108 is connected by a narrow diagonal metallized strip to inner side electrode 106. On the other side or region A, an outer side electrode 112 and an inner side electrode 114 are deposited near the base of the tine. Outer side electrode 112 is connected by a laterally extending metallized strip 116 to outer side electrode 100. Inner side electrode 114 is connected by a narrow diagonal metallized strip to outer side electrode 108 and by a laterally extending metallized strip 118 to inner side electrode 102. A pair of connector pads 120, 122 are deposited in the corners of stem 14. Pad 120 is connected to outer side electrodes 100, 112.

FIG. 14 shows a view of the bottom side of the tuning fork illustrated in FIGS. 11, 12 and 13. For simplicity, the electrodes shown in FIG. 14 which are positioned directly opposite to electrodes shown in FIG. 11 have been given identical primed reference numerals. Note, however, that the electrodes positioned directly opposite to each other on opposite sides of tines 16 and 18 in FIGS. 11 and 14 are of opposite polarity during operation, except for terminals 120, 120' and 122, 122'. As shown in FIG. 14, a narrow metallized strip extends from side electrode 92' across tine 16 and across edge 22 where it joins a similar strip from inner side electrode 94. Inner side electrode 94' is connected by a narrow diagonal metallized strip to outer side electrode 96'. At the upper end of outer side electrode 96', a narrow metallized strip extends to and across outer edge 20 where it joins a similar strip from outer side electrode 92. At the lower end of outer side electrode 96', a narrow metallized strip extends to and across outer edge 20 where it joins a similar strip from outer side electrode 100. Outer side electrode 96' is also joined by a narrow diagonal metallized strip to inner side electrode 102'. From the upper end of inner side electrode 102', a narrow metallized strip extends to and across inner edge 22 where it joins a similar strip extending from inner side electrode 98. At the upper end of inner side electrode 98', a narrow metallized strip extends to and across edge 22 where it joins a similar strip extending from inner side electrode 94.

On the bottom side of tine 18, the lower end of outer side electrode 104' includes a narrow metallized strip which extends to and across edge 20 where it joins a similar strip from outer side electrode 108. At the upper end of inner side electrode 106', a narrow metallized strip extends to and across edge 22 where it joins a similar strip extending from outer side electrode 104. At the lower end of inner side electrode 106', a narrow metallized strip extends to and across edge 22 where it joins a similar strip extending from inner side electrode 110. At the lower end of inner side electrode 110', a narrow metallized strip extends to and across side edge 22 where it joins a similar strip extending from inner side electrode 114. At the upper end of outer side electrode 112', a narrow metallized strip extends to and across edge 20 where it joins a similar strip extending from outer side electrode 108. Narrow diagonal metallized strips connect outer side electrode 108' to inner side electrodes 106' and 114'.

In operation of the embodiment shown in FIGS. 11-14, alternating current is applied to pads 120, 122 so that an alternating field is directed through the thickness of the tuning fork between the electrodes positioned on its opposite surfaces. To cause flexural movement of tines 16 and 18 in the direction of the width of the tines, the material of tuning fork 12 preferably is a plate of quartz having the conventional designation (XYtl) $-25°$ to $+25°/-55°$ to $+55°$. When a tuning fork is made with electrodes configured in the manner just described, the polarity is reversed for the oppositely positioned electrodes on each side of each tine. Also, the polarities of the electrode pairs are reversed from one tine to the other so that the tines will deflect in opposite directions.

Figure 15:
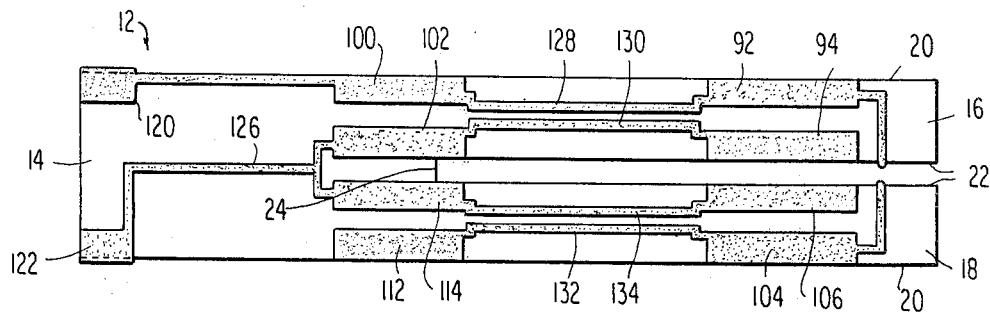
FIG. 15 shows a modified version of the embodiment of FIGS. 11-14.
Figure 16:
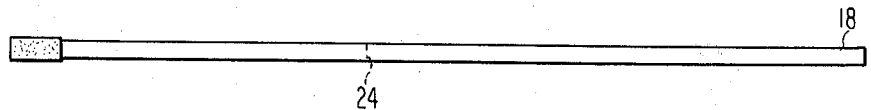
FIG. 16 shows a side view of the embodiment of FIG. 15.
Figure 17:
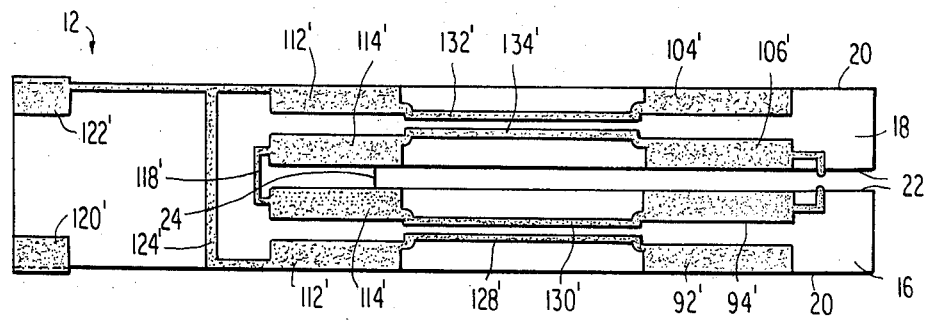
FIG. 17 shows a bottom view of the embodiment of FIG. 15.

A simplified version of the embodiment shown in FIGS. 11-14 is illustrated in FIGS. 15-17. This embodiment is similar in some respects to the embodiment of FIGS. 8-10 in that the electrode pairs between regions A and B have been eliminated. Electrodes and conductors corresponding in location to those shown in FIGS. 11-14 have been given identical reference numerals in FIGS. 15-17. Thus, side electrode 92 is connected to side electrode 100 by a narrow metallized strip 128 which extends along tine 16 near its center. Similarly, inner side electrode 94 is connected to inner side electrode 102 by a narrow metallized strip 130 which also extends along tine 16 near its center. Inner side electrodes 102, 114 are connected by metallized strip 126 to pad 122. Outer side electrodes 104 and 112 are connected by a narrow metallized strip 132 which extends along tine 18 near its center. Inner side electrodes 106 and 114 are connected by a narrow metallized strip 134 which also extends along tine 18 near its center. At the upper ends of outer side electrodes 92, 104 narrow metallized strips extend laterally to and across inner edges 22 where they join similar strips extending from the upper end of inner side electrodes 94', 106' on the bottom surface of the tuning fork. As in the case of the embodiment of FIGS. 8-10, the narrow strips 128, 128'-134, 134' extend along their tines near the centers of the tines so that adverse coupling will be minimized where these strips extend between regions A and B.

Figure 18:
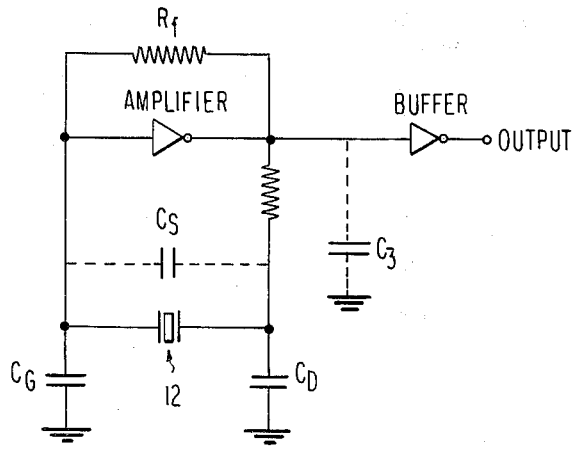
FIG. 18 is a schematic illustration of a conventional oscillator circuit suitable for use with a tuning fork according to the present invention.
Figure 19:
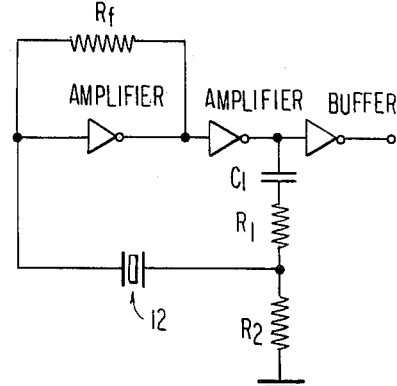
FIG. 19 is a schematic illustration of another conventional oscillator circuit suitable for use with a tuning fork according to the present invention.

FIGS. 18 and 19 illustrate conventional Pierce and series oscillators which may be used with a tuning fork 12 according to the present invention. These oscillators are completely conventional in structure and are described in detail in Bulletin Nos. F-324A and F-325 published in June, 1979, by the Statek Corporation of Orange, Calif. The disclosure of these publications is hereby incorporated by reference into this application. Those skilled in the art will appreciate that by suitable adjustment of the values of the various resistances, capacitances, amplifier gains and so forth used in the circuits shown in FIGS. 18 and 19, the operating frequency may be adjusted as necessary to accommodate a second overtone tuning fork according to the present invention.

Industrial Applicability

Microresonators of tuning fork configuration which are made in accordance with the present invention may be used in a wide variety of applications, including time measuring systems, pressure transducers, temperature transducers, force transducers and similar applications throughout industry.

Having described my invention in sufficient detail to enable those skilled in the art to make and use it, I claim:

1. An improved, flexural-mode piezoelectric tuning fork, comprising:
   a stem portion;
   a pair of tines extending from said stem;
   a slot between said tines, said slot having a crotch where said tines join said stem; and
   electrode means mounted on said tines for causing said fork to oscillate preferentially at its second overtone frequency when oscillating electrical fields are applied to said electrode means and for suppressing fundamental and first overtone components in the oscillations of said fork.

2. A tuning fork according to claim 1, wherein said tines and stem are defined in part by first and second substantially planar opposed surfaces and said electrode means comprises four sets of electrodes disposed on said first surface with two sets spaced along the length of each tine, each set of electrodes comprising a pair of side electrodes disposed along at least a portion of the opposite edges of its tine and central electrode disposed between and spaced from each pair of peripheral electrodes, each set of electrodes being spaced along its tine so that as the tine vibrates at its second overtone frequency, the material of the edge of the tine underlying substantially the entire length of each side electrode will experience at any given time only a single state of stress at that electrode, said single state being either a tensile stress, a compressive stress or zero stress.

3. A tuning fork according to claim 2, wherein said tines and stem are made from a plate of quartz crystal, said plate being formed with its thickness initially measured in the Z direction of said crystal and its length initially measured in the Y direction of said crystal, said plate being rotated about the X axis of said crystal by an angle $\theta$ in the range $-25°$ to $+25°$ and about the Y' axis by an angle $\Phi$ in the range of $-35°$ to $+35°$.

4. A tuning fork according to claim 2, wherein said electrode means comprises four further sets of electrodes disposed on said second surface with two of said further sets spaced along the length of each tine, each further set of electrodes comprising a further pair of side electrodes disposed along at least a portion of the opposite edges of its tine and a further central electrode disposed between and spaced from each pair of further side electrodes, each further set of electrodes being spaced along its tine so that as the tine vibrates at its second overtone frequency, the material of the edge of the tine underlying substantially the entire length of each side electrode will experience at any given time only a single state of stress at the electrode, said single state being either a tensile stress, a compressive stress or zero stress.

5. A tuning fork according to claim 4, wherein on said first surface, each tine has a first set of electrodes positioned near the tip of the tine and a second set of electrodes positioned near the base of the tine; on said second surface, each tine has a third, further set of electrodes positioned near the tip of the tine and a fourth, further set positioned near the base of the tine; further comprising means for electrically interconnecting the central electrodes of each tine for operation at a common polarity and means for electrically interconnecting the side electrodes of each tine for operation at a common, opposite polarity.

6. A tuning fork according to claim 5, further comprising means interconnecting said sets and said further sets for causing the electrodes on one tine to operate at opposite polarity from their counterparts on same surface of the other tine.

7. A tuning fork according to claim 5, wherein each tine is further defined by an exterior edge extending from said stem to the tip of the tine and interior edge extending from said crotch to said tip, the side electrodes of said first and third sets and said second and fourth sets being interconnected along said interior and exterior edges.

8. A tuning fork according to claim 1, wherein said tines and stem are defined in part by first and second substantially planar opposed surfaces and said electrode means comprises four pairs of side electrodes disposed on said first surface with two pairs disposed along the length of each tine, each pair of side electrodes being disposed on said first surface with two pairs disposed along the length of each tine, each pair of side electrodes being disposed along at least a portion of the opposite edges of its tine, each pair of side electrodes being spaced along its tine so that as the tine vibrates at its second overtone frequency, the material of the edge of the tine underlying substantially the entire length of each side electrode will experience at any given time only a single state of stress at that electrode, said single state being either a tensile stress, a compressive stress or zero stress.

9. A tuning fork according to claim 8, wherein said tines and stem are made from a plate of quartz crystal, said plate being formed with its thickness initially measured in the X direction of said crystal and its length measured in the Y direction of said crystal, said plate being rotated about the X of said crystal by an angle $\theta$ in the range of $-25°$ to $+25°$ and about the Y' axis by an angle $\Phi$ in the range of $-55°$ to $+55°$.

10. A tuning fork according to claim 8, wherein said electrode means comprises four further pairs of side electrodes disposed on said second surface with two of said further pairs spaced along the length of each tine, each further pair of side electrodes being spaced along its tine so that as the tine vibrates at its second overtone frequency, the material of the edge of the tine underlying substantially the entire length of each further side electrode will experience at any given time only a single state of stress at that electrode, said single state of stress being either a tensile stress, a compressive stress or zero stress.

11. A tuning fork according to claim 10, wherein each tine has an outer edge extending from said base and an inner edge extending from said crotch; on said first surface, each tine has a first pair of electrodes positioned along said edges near the tip of the tine and a second pair of electrodes positioned along said edges near the base of the tine; on said second surface, each tine has a third, further pair of electrodes positioned along said edges near the tip of the tine and a fourth, further pair of electrodes positioned along said edges near the base of the tine; further comprising means for electrically interconnecting at a common polarity the outer side electrodes of said first and second pairs with the inner side electrodes of said third and fourth pairs; and means for interconnecting at a common, opposite polarity the inner side electrodes of said first and second pairs with the outer side electrodes at said third and fourth pairs.

12. A tuning fork according to claim 11, further comprising means interconnecting said pairs and said further pairs for causing the electrodes on said first surface of each tine to operate at the opposite polarity from their counterparts on said second surface of each tine.

13. An improved, flexural mode piezoelectric tuning fork, comprising:

a stem portion;

a pair of tines extending from said stem, each of said tines being defined in part by first and second substantially planar, opposed surfaces;

a slot between said tines, said slot having a crotch where said tines join said stem; and electrode means mounted on said tines for causing said fork to oscillate preferentially at its second overtone frequency when oscillating electrical fields are applied to said electrode means and for suppressing fundamental and first overtone components in the oscillations of said fork, said electrode means comprising six sets of electrodes disposed on said first surface with three sets spaced along the length of each tine, each set of electrodes comprising a pair of side electrodes disposed along at least a portion of the opposite edges of its tine and a central electrode disposed between and spaced from each pair of side electrodes, each set of electrodes being spaced along its tine so that as the tine vibrates at its second overtone frequency, the material of the edge of the tine underlying substantially the entire length of each side electrode will experience at a given instant only a single state of stress at that electrode, said single state being either a tensile stress, a compressive stress or zero stress.

14. A tuning fork according to claim 13, wherein said opposed surfaces are parallel to the plane of vibrations of said tines.

15. A tuning fork according to claim 13, wherein said electrode means comprises six further sets of electrodes disposed on said second surface with three of said further sets spaced along the length of each tine, each further set of electrodes comprising a further pair of side electrodes disposed along at least a portion of the opposite edges of its tine and a further central electrode disposed between and spaced from each pair of further side electrodes, each further set of electrodes being spaced along its tine so that as the tine vibrates at its second overtone frequency, the material of the edge of the tine underlying substantially the entire length of each side electrode will experience at a given instant only a single state of stress at that electrode, said single state being either a tensile stress, a compressive stress or zero stress.

16. A tuning fork according to claim 15, wherein on said first surface, each tine has a first set of electrodes positioned near the tip of the tine, a second set of electrodes positioned near the base of the tine, and a third set of electrodes positioned therebetween; on said second surface, each tine has a fourth, further set of electrodes positioned toward the tip of the tine, a fifth, further set of electrodes positioned toward the base of the tine, and a sixth, further set of electrodes positioned therebetween; further comprising means for electrically interconnecting the central electrodes of said first, second, fourth and fifth sets of electrodes with the side electrodes of said third and sixth sets of electrodes for operation at a common polarity; and means for electrically interconnecting the central electrodes of said third and sixth sets of electrodes with the side electrodes of said first, second, fourth and fifth sets of electrodes for operation at a common, opposite polarity.

17. A tuning fork according to claim 16, further comprising means interconnecting said sets and said further sets of electrodes for causing each electrode of the first to sixth sets of electrodes on one tine to operate at opposite polarity from its counterpart among the first to sixth sets of electrodes on the other tine.

18. A tuning fork according to claim 16, wherein each tine is further defined by an exterior edge extending from said stem to the tip of the tine and an interior edge extending form said crotch to said tip, the side electrodes of said first and fourth sets being interconnected along said interior and exterior edges, the side electrodes of said third and sixth sets being interconnected along said interior and exterior edges, and the side electrodes of said second and fifth sets being interconnected along said interior and exterior edges.

19. A tuning fork according to claim 13, wherein said tines and stem are made from a plate of quartz crystal, said plate being formed with its thickness initially measured in the Z direction of said crystal and its length initially measured in the Y direction of said crystal, said plate being rotated about the X axis of said crystal by an angle $\theta$ in the range of $-25°$ to $+25°$ and about the Y' axis by an angle $\Phi$ in the range of $-35°$ to $+35°$.

20. An improved, flexural mode piezoelectric tuning fork, comprising:

a stem portion;

a pair of tines extending from said stem, each of said tines being defined in part by first and second substantially planar, opposed surfaces;

a slot between said tines, said slot having a crotch where said tines join said stem; and electrode means mounted on said tines for causing said fork to oscillate preferentially at its second overtone frequency when oscillating electrical fields are applied to said electrode means and for suppressing fundamental and first overtone components in the oscillations of said fork, said electrode means comprising six pairs of side electrodes disposed on said first surface with three pairs disposed along the length of each tine, each pair of side electrodes being disposed along at least a portion of the opposite edges of its tine, each pair of side electrodes being spaced along its tine so that as the tine vibrates at its second overtone frequency, the material of the edge of the tine underlying substantially the entire length of each side electrode will experience at any given instant only a single state of stress at that electrode, said single state being either a tensile stress, a compressive stress or zero stress.

21. A tuning fork according to claim 20, wherein said tines and stem are made from a plate of quartz crystal, said plate being formed with its thickness initially measured in the X direction of said crystal and its length measured in the Y direction of said crystal, said plate being rotated about the X of said crystal by an angle $\theta$ in the range of $-25°$ to $+25°$ and about the Y' axis by an angle $\Phi$ in the range of $-55°$ to $+55°$.

22. A tuning fork according to claim 20, wherein said electrode means comprises six further pairs of side electrodes disposed on said second surface with three of said further pairs spaced along the length of each tine, each further pair of side electrodes being disposed along at least a portion of the opposite edges of its tine, each further pair of side electrodes being spaced along its tine so that as the tine vibrates at its second overtone frequency, the material of the edge of the tine underlying substantially the entire length of each further side electrode will experience at any given instant only a single state of stress being either a tensile stress, a compressive stress or zero stress.

23. A tuning fork according to claim 22, wherein each tine has an outer edge extending from said base and an inner edge extending from said crotch; on said first surface, each tine has a first pair of electrodes positioned along said edges near the tip of the tine, a second pair of electrodes positioned along said edges near the base of the tine, and a third pair of electrodes positioned along said edges therebetween; on said second surface, each tine has a fourth, further pair of electrodes positioned along said edge near the tip of the tine, a fifth, further pair of electrodes positioned along said edges near the base of the tine, and a sixth, further pair of electrodes positioned along said edges therebetween; further comprising means for electrically interconnecting at a common polarity the outer side electrodes of said first, second and sixth pairs with the inner side electrodes of said third, fourth and fifth pairs; and means for interconnecting at a common, opposite polarity the inner side electrodes of said first, second and sixth pairs with the outer side electrodes of third, fourth and fifth pairs.

24. A tuning fork according to claim 23, further comprising means interconnecting said pairs and said further pairs for causing the electrodes on said first surface of each tine to operate at opposite polarity from their counterparts on said second surface of each tine.

* * * * *